United States Patent [19]

Turek

[11] Patent Number: 4,775,573

[45] Date of Patent: Oct. 4, 1988

[54] MULTILAYER PC BOARD USING POLYMER THICK FILMS

[75] Inventor: Joseph A. Turek, Downers Grove, Ill.

[73] Assignee: West-Tronics, Inc., Bensenville, Ill.

[21] Appl. No.: 34,791

[22] Filed: Apr. 3, 1987

[51] Int. Cl.⁴ .............................................. B32B 9/00
[52] U.S. Cl. .................................... 428/209; 428/901; 174/68.5
[58] Field of Search .............. 428/209, 901; 174/68.5

[56] References Cited

U.S. PATENT DOCUMENTS

| | | | |
|---|---|---|---|
| 3,034,930 | 5/1962 | Founriat, Jr. | 117/212 |
| 3,142,047 | 7/1964 | Henderson | 340/174 |
| 3,348,990 | 10/1967 | Zimmerman et al. | 156/293 |
| 3,436,819 | 4/1969 | Lunine | 29/628 |
| 3,469,019 | 9/1969 | Reimann | 174/68.5 |
| 3,506,482 | 4/1970 | Hirohata et al. | 117/212 |
| 3,742,597 | 7/1973 | Davis | 29/625 |
| 3,932,932 | 1/1976 | Goodman | 29/625 |
| 4,187,339 | 2/1980 | Caroyl | 428/208 |
| 4,211,603 | 7/1980 | Reed | 156/659 |
| 4,301,192 | 11/1981 | Plichta et al. | 427/97 |
| 4,372,046 | 2/1983 | Suzuki | 29/852 |
| 4,388,136 | 6/1983 | Huie et al. | 156/252 |
| 4,389,278 | 6/1983 | Kai | 156/630 |
| 4,486,738 | 12/1984 | Sadlo et al. | 338/320 |
| 4,522,888 | 6/1985 | Eichelberger et al. | 427/103 |
| 4,543,715 | 10/1985 | Iadarola et al. | 29/852 |
| 4,554,229 | 11/1985 | Small, Jr. | 430/17 |
| 4,554,732 | 11/1985 | Sadlo et al. | 29/620 |
| 4,636,018 | 1/1987 | Stillie | 339/17 M |
| 4,642,569 | 2/1987 | Hayes et al. | 324/318 |

OTHER PUBLICATIONS

Schaeler, S. D., Green, W. J., "Developments in Additive Circuitry Using Polymer Thick Film Materials", Circuit Expo Proceedings, (1983), Lake Publishing Co., Libertyville, Ill.

Stewart, T. I., Lambson, M. A., Turvey, S. P., Baker, T. H., "Introduction to Polymer Thick Films", Screen Imaging Technology for Electronics, Nov., 1985.

Margolin, K. Sagir, E., Glaessgen, R., "Multilayer, Surface Mount Technology: The PTF Connection", Screen Imaging Tech. for Electronics, vol. 1, No. 4, pp. 44-47, (1986).

"Designing High Density Printed Circuit Boards Cost Effectively", E. I. DuPont de NeMours & Co., (1981).

"Conductive Adhesives and Coatings, Matthey LEC TM," (1986), Product Information from Johnson Matthey Chemicals, Ltd., Orchard Road Royston Herts SG85HE, England.

Primary Examiner—John E. Kittle
Assistant Examiner—P. J. Ryan
Attorney, Agent, or Firm—Leydig, Voit & Mayer

[57] ABSTRACT

A multilayer printed circuit board which reliably and economically marries conventional copper clad printed circuit board technology with polymeric conductors and insulators. Reliability is enhanced by forming all solder pads of copper, providing conductive tails on solder pads which are to be connected by polymeric inks, and ultimately forming a solder resist over all but the solder pads. As a result, polymer inks can be applied to both sides of the board, and the completed board can be subject to conventional solder dipping or wave soldering operations. According to one feature of the invention, a thin dielectric layer can be applied as intermediate to planar conductive layers which form a power plane having built-in distributed capacitance for decoupling.

12 Claims, 7 Drawing Sheets

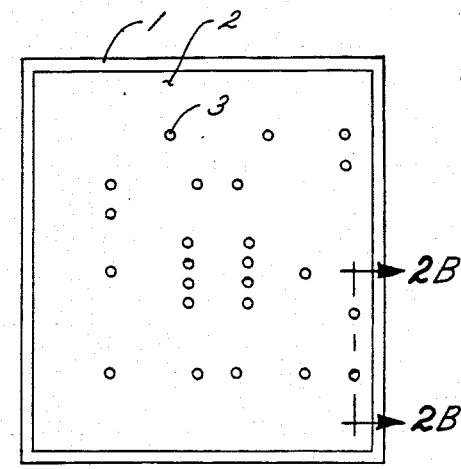
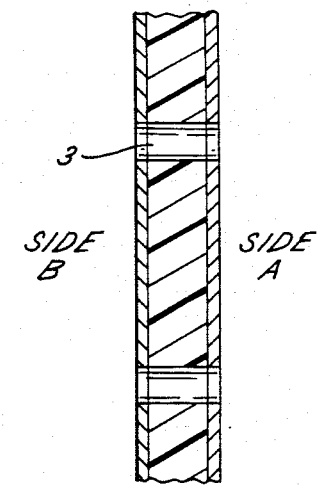
FIG. 2A
FIG. 2B
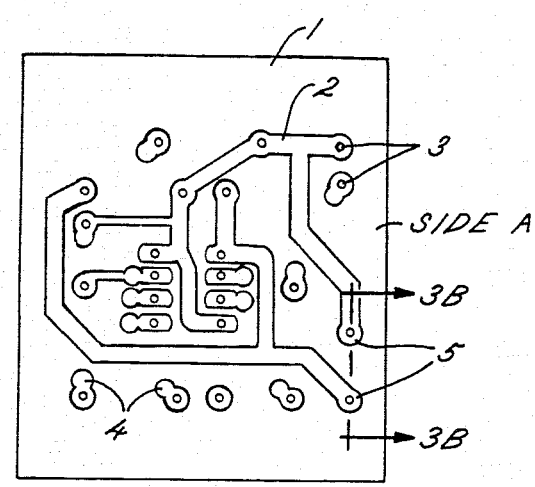
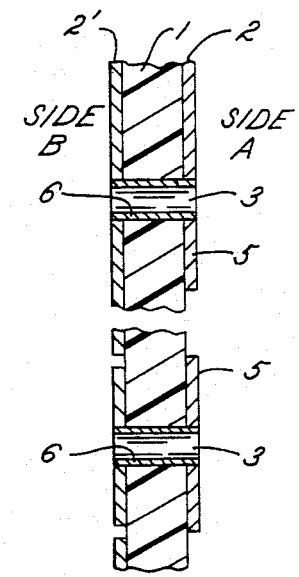
FIG. 3A
FIG. 3B

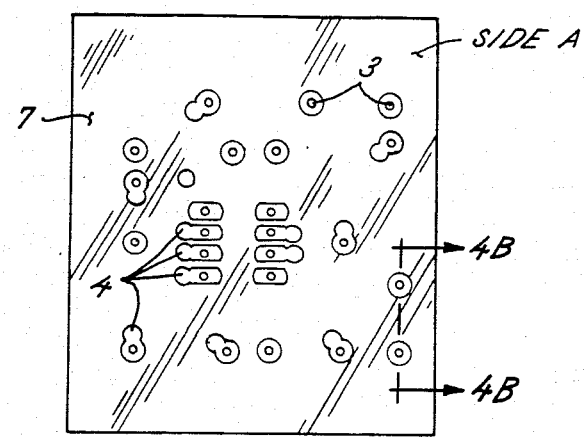
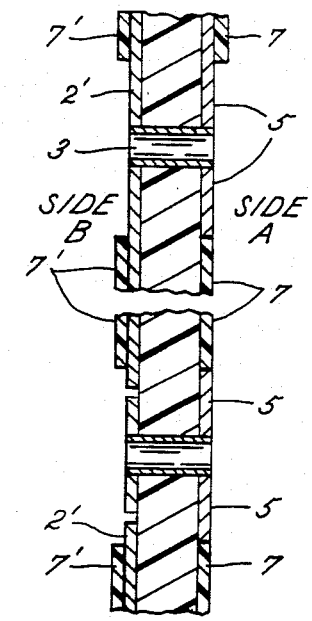
FIG. 4A
FIG. 4B
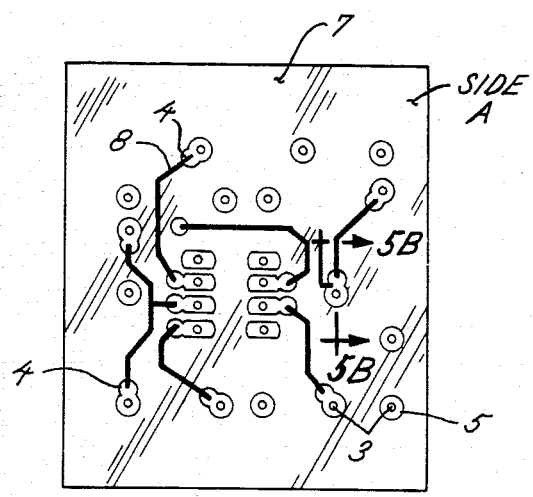
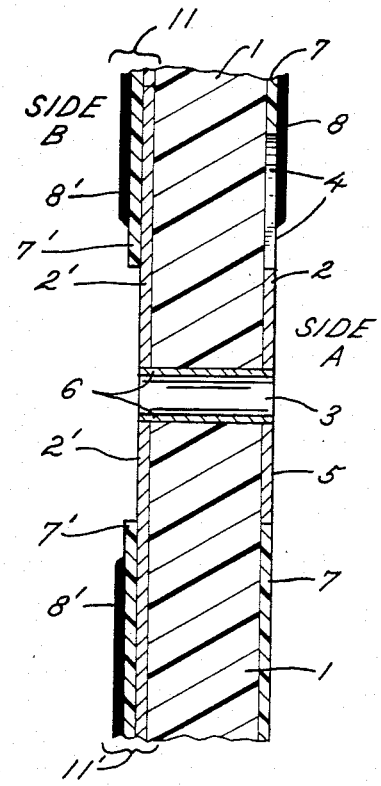
FIG. 5A
FIG. 5B

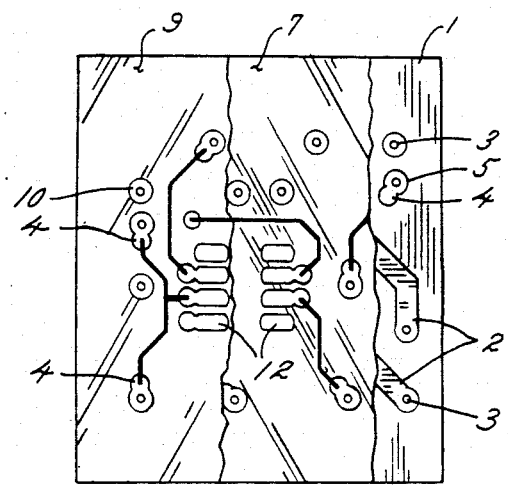
FIG. 8A  SIDE A
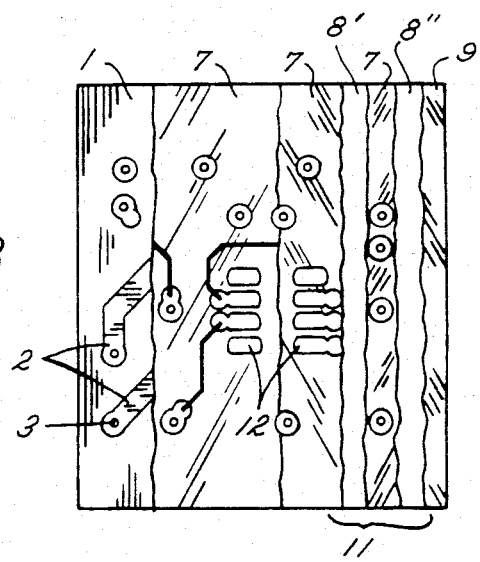
FIG. 8B  SIDE B

SIDE A

SIDE B

MULTILAYER PC BOARD USING POLYMER THICK FILMS

BACKGROUND OF THE INVENTION

1. Field Of The Invention

The present invention relates generally to circuit boards and more specifically to multilayer printed circuit boards and an improved method for fabricating such boards.

2. The Prior Art

A very common form of printed circuit board uses a fiberglass/epoxy substrate having copper foil on one or both sides. Typically, a photoresist is applied to the copper, then the coated board is exposed with the desired circuit pattern. The board is then etched to remove the unwanted copper, leaving solder pads for connection to the components interconnected by circuit traces for providing power and signals to the electronic components. If connections between the conductor patterns on the two sides of the board are necessary, they are usually achieved by providing plated through holes, i.e., holes drilled and electrolytically plated to connect conductors on opposite sides of the board.

The miniaturization of electronic components and the increasingly dense circuit packing that it has fostered, has imposed very stringent demands on printed circuit board technology. All too often it is not possible to form all the necessary connections between densely packed circuits using just two sides of a printed circuit board. In those cases, it is often typical to resort to multilayer circuit boards.

Conventional multilayer circuit boards can be conceptualized or made up of multiple units of more or less standard glass/epoxy copper clad boards. Typically, after circuit patterns are formed on the boards by conventional etching techniques, the individual boards are laminated together. Attention must be given to making connections between selected ones of the multiple layers of circuit patterns, often using ferrules, vias or plated through holes between appropriate layers of the laminated structure. U.S. Pat. Nos. 3,436,819 and 4,388,136 illustrate certain techniques used in producing conventional multilayer circuit boards, as well as some of the problems there involved.

While the multilayer circuit board has provided the ability to distribute interconnections among a number of isolated planes, thereby to allow the dense packing of complex microelectronic circuit elements, that provision has not come without its difficulties. The primary drawback is cost. The individual boards which are to make up the laminate must be drilled, exposed, etched and assembled to rather rigorous standards, since when laminated together, they must be in precise registration with each other. A number of techniques have been developed for making interconnections between selected points in the conductive pattern on various layers, but none are without their own characteristic difficulties. Laminating the various layers together can introduce further complications. The end result is to take double-sided printed circuit board technology, itself a complication over single-sided technology, and multiply the level of complexity and therefore the cost.

It has been proposed, in order to avoid the complexity of conventional multilayer circuit board techniques, to utilize a conventional printed circuit board and to apply to that board selective interconnections by way of deposited traces of conductive resin. If more than one layer of conductive traces is desired, the layers (or the individual traces), can be separated by an insulating layer. Such an approach is illustrated in Cayrol U.S. Pat. No. 4,187,339.

While that approach facially has the advantage of significantly reducing the cost of a multilayer printed circuit board, it is not believed to have achieved commercial acceptance for a number of reasons. The conductive resins disclosed in that patent are believed unsuitable for use with today's printed circuit board technology. The structure disclosed in that patent appears to be incompatible with dip soldering techniques for plating the conductive copper, or wave soldering techniques for final soldering of components on the board. For those reasons, it appears that all of the conductive and insulative layers applied to the board were applied to the component side, leaving copper pads on the other side for making solder connections to circuit components. That requirement dictates that all boards using that technique be double sided with plated through holes. Even with all of the polymeric traces confined to one side of the board, steps must be taken to protect that side during soldering to prevent damage to the polymeric conductors. Finally, polymer circuit boards have been avoided in the past because of the large quantity of conductive polymer needed to make the traces sufficiently conductive, and due to the historical inability of the polymers to remain bonded to the board in their desired location.

SUMMARY OF THE INVENTION

It is a primary object of the present invention to provide an improved multilayer printed circuit board which retains the flexibility of conventional multilayer circuit boards, but which can be manufactured at a fraction of the cost.

It is a further object of this invention to provide an improved circuit board manufacturing process which retains the conventionality of solder plated copper pads for soldering to the electrical components, but provides inexpensive yet reliable, conductive polymeric traces for making connections between the pads.

According to one aspect of the invention, it is an object to provide an improved circuit board having a ground-power plane configuration whereby power supply decoupling is accomplished, at least in part, by providing substantially continuous ground and power planes along the surface of the circuit board separated by a dielectric layer which provide distributed decoupling capacitance.

In accordance with the present invention, there is provided a reliable inexpensive multilayer circuit board, at least in part, using conductive polymeric traces for establishing electrical connections between a plurality of electrical components mounted on the board. A supporting substrate has a copper layer on at least one side etched to form an array of bonding pads for receiving the components to be mounted on the circuit board, and bonding tails connected to the bonding pads for providing protected electrical connections to the bonding pads. A dielectric layer is deposited over the copper layer but leaving the tails and the pads exposed. Conductive polymer traces are then deposited over the dielectric layer to interconnect selected ones of the tails thereby to form connections between selected ones of said pads. Finally, a solder mask is deposited over the top layer, leaving the pads exposed but covering the tails thereby to shield the polymer. The board is solder dipped to solder plate the exposed solder pads for providing a surface for solder connections to the electrical components.

Another aspect of the invention is a method of producing a multiple layer circuit board for mounting and electrically interconnecting circuit components. The steps include providing a supporting substrate having copper film on at least one side. The film is etched to produce an array of solder pads for receiving the circuit components to be mounted on the circuit board. The step of etching also includes forming conductive tails connected to the solder pads, and in many applications, forming a network of copper circuit traces which interconnect at least some of the solder pads. A dielectric layer is then deposited over the copper layer leaving the tails and pads exposed while insulating the copper layer. Conductive polymer traces are then applied to connect selected tails, thereby electrically interconnecting the associated solder pads. It is at this point in the process that multiple layers of circuitry can be fabricated by successively depositing alternating layers of conductive polymer traces and insulating dielectric. A solder mask is applied over the polymer layers leaving the pads exposed but covering the tails. The polymer traces are thereby shielded—and will be unaffected when the completed circuit board is dipped in a solder bath to apply a layer of solder to the exposed bonding pads.

BRIEF DESCRIPTION OF THE DRAWINGS

Other objects and advantages will become apparent upon reference to the following detailed description in conjunction with the drawings in which:

FIGS. 2A–7A and 2B–7B illustrate various stages in the preparation of a multilayer circuit board exemplifying the present invention, and more particularly;

FIG. 2A and 2B show a two sided copper clad board with drilled and plated through holes;

FIG. 3A and 3B show the circuit board of FIG. 2A with one copper etched to form solder pads and optional copper conductive traces;

FIG. 4A and 4B show the circuit board of FIG. 3A having a primary insulating layer deposited over the copper conductive traces;

FIG. 5A and 5B show the circuit board of FIG. 4A with conductive polymer having been deposited over the primary insulating layer to form an additional layer of printed circuit traces;

FIG. 7A and 7B show the circuit board of FIG. 6A after a solder dip to the solder plate the solder pads;

FIG. 8A is a plan view of the "component side" (Side A) of another embodiment of the two-sided multilayer circuit board of the present invention intended to provide distributed power supply decoupling;

FIG. 8B is a plan view of the "solder side" (Side B) of the two-sided multilayer circuit board of FIG. 8A;

DESCRIPTION OF THE PREFERRED EMBODIMENTS

The Circuit Board

Figure 1A:
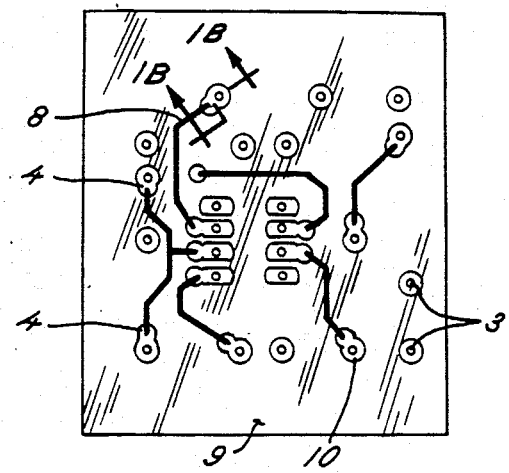
FIG. 1A is a plan view of the "component side" (Side A) of a two sided multilayer circuit board.

While the invention will be described in connection with certain preferred embodiments, it will be understood that it is not intended to limit the invention to these particular embodiments. On the contrary, it is intended to cover all alternatives, modifications, and equivalents included within the spirit and scope of the invention as defined by the appended claims.

As will become more apparent, the invention provides for a large number of different configurations of printed circuit boards. A few will be described below in order to teach the practice of the invention. However, in order to put the invention in perspective, the following general comments are also offered.

The general field to be considered is multilayer printed circuit boards. Multilayer printed circuit boards, as used herein, are considered to be those which have at least two conductive layers on one side of the printed circuit board. In the simplest configuration, all conductive patterns can be on one side of the printed circuit board, which makes that application of the invention a variant of the single sided board. In the more complex configuration, conductive patterns are configured on both sides of the printed circuit board.

The manner in which the multiple layers are configured will depend in some measure on the nature of the circuit carried by the printed circuit board. In all cases, it is preferable to use a conventional printed circuit board, such as G10 glass epoxy, having a copper foil layer on at least one side. Often, the copper layer is on both sides. In either event, the copper layer is etched to leave a pattern including solder pads to which the electrical components of the circuit board are to be mounted. The copper pads are altered, according to the invention, to include solder tails, also formed of the copper foil, connected to the solder pads but in a position to ultimately be coated with a solder resist and thereby protected from the environment. Having etched the printed circuit board to leave the solder pads and associated copper tails, the board is then covered with an insulative epoxy which covers the board except for the solder pads and copper tails. Thus, the copper tails are available for forming connections to the associated solder pads.

Conductive polymer is deposited on the insulative layer, and connected to selected ones of the copper tails to thereby form connections between the associated solder pads. Alternate layers of insulative and conductive polymer are deposited to form all the necessary connections. Ultimately, a solder mask layer is deposited on the circuit board which covers all of the polymer, but leaves the solder pads exposed. Since the copper tails extend from the solder pads, and since the mask for the conductive polymer overlaps the copper tails, the tails and therefore the polymer which connects to the tails are covered by the solder mask. As a result, migration of the conductive polymer is prevented and the tendency of the polymer to lift from the copper pads is eliminated. The board can be solder dipped to form solder bonding pads for connection to the electrical components, and the solder mask prevents the molten solder from affecting anything but the part of the copper foil which is left exposed by the solder mask. Furthermore, when the board is "stuffed" i.e., electronic components are installed in their intended locations, with electrical components, it can be wave or hand soldered in conventional fashion using standard techniques since all connections are made to the standard type of plated copper pad typically used within the industry.

In accordance with one aspect of the invention, a power plane can be arranged in such a way that a distributed decoupling capacitance is provided over the surface of the board and between the layers of the power plane. One of the layers of the copper foil can be used as one of the power planes, a thin layer of polymeric insulator deposited over the copper layer, and a second conductive polymer layer deposited directly on the dielectric layer used as the opposite pole of the power plane. The thickness of the insulative polymeric layer is typically held to about 1 mil which, with the capacitive characteristic of the dielectric, provides a distributed capacitance between the layers of the power plane of about 0.001 microfarads per square inch. Such a distributed capacitance tends to eliminate or reduce the need for distributed decoupling capacitance and provide excellent radio frequency decoupling.

Alternatively, the same effect can be achieved by forming both of the power planes of conductive polymer separated by a dielectric polymer. The main requirement in this aspect is the provision of sufficiently reduced impedance to suit the needs of the application. It is, of course, known that the copper foil is typically more conductive than a conductive polymer and therefore if the current draw of the circuit is intended to be significant, it is desirable to utilize the copper as at least one and perhaps both of the elements of the power plane.

In all its configurations, the invention is characterized by the provision, on the same side of the circuit board, of both a copper conductive pattern including solder pads with associated conductive tails, and polymeric conductors connecting selected ones of the conductive tails, thereby connecting the associated solder pads. Insulative polymer is deposited as needed between the conductive layers, and a solder resist applied over the entire side of the board with the exception of the solder pads so that, upon solder dipping, the solder pads are plated while the polymeric conductors are protected. In its most expansive configuration, such circuitry is applied to both sides of the board, providing significant economies over attempts to provide equivalent circuitry by means of conventional multilayer circuit board techniques. It is not unusual to produce a multilayer circuit board according to the invention at a cost of about 60% of that associated with conventional multilayer techniques.

Referring now to FIG. 1A, there is shown an exemplary embodiment of the present invention in the form of a two sided multilayer circuit board, having a double layer of electrical circuitry on the component side (Side A) and a power-ground plane on the solder side (Side B). It should be stressed that the designation of the alternative sides of the substrate as "component" or "solder" sides is for the sake of clarity only. As will be shown, the board of this invention is capable of carrying components on both sides of the substrate simultaneously. One of the primary advantages of the fabrication process of this invention is the ability to fabricate a myriad of circuit permutations inexpensively. A number of alternative embodiments will be disclosed hereafter, however for the sake of simplicity the invention will first be disclosed in connection with a four layer board embodiment.

Figure 1B:
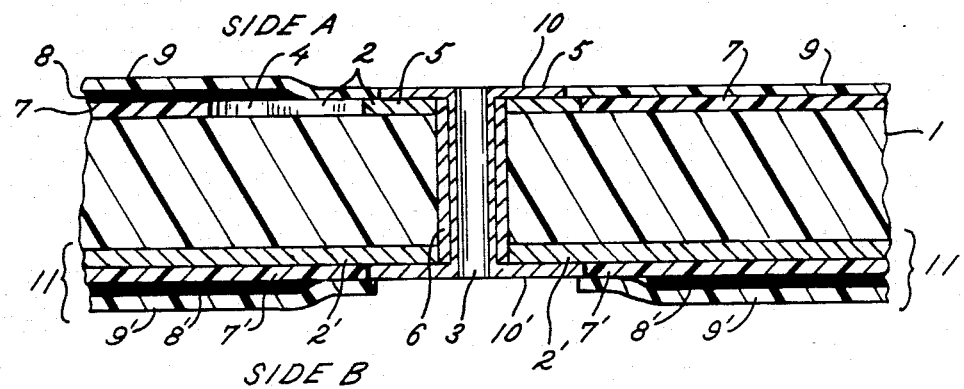
FIG. 1B is a partial sectional view, enlarged, of a two sided multilayer circuit board constructed in accordance with the present invention.

It is seen that the board is based on a substrate 1. Examining the sectional view of the circuit board, FIG. 1B, it can be seen that the substrate 1 carries multiple conducting and insulative layers on both sides of the board. In order to illustrate the invention, the thickness of the layers is exaggerated, as will be readily apparent to those skilled in this art. The substrate 1 can be made of any number of nonconductive synthetic polymers which offer a high heat resistance as well as the ability to dissipate thermal energy such as fiberglass in an epoxy binder. A popular grade of such substrate is identified in the industry by the designator G10. It may sometimes be necessary to have a substrate with higher strength and rigidity. There are a number of plastics commonly known in the art which can be used depending on the specific application intended. It should be noted the invention can also be practiced with substrates used for flexible printed circuits. Deposited on at least one and often both sides of the substrate are copper layers which are etched to form the first conductive pattern 2, 2' on the associated surface of the board. As can be seen in FIG. 1A, a plurality of holes 3 are drilled through the substrate 1 and can also penetrate the conductive copper pattern 2, 2'. The holes 3 serve a dual purpose of facilitating attachment of circuit components to the substrate 1 as well as providing an avenue for electrical communication between circuitry on opposite sides of the substrate 1. Also possible is the production of a multilayer printed circuit board for surface mounted components which reduces or eliminates the need for drilled holes 3. In such a case surface mounted components are mounted on the substrate surface, being bonded to the solder pads 5 using conventional surface mounting techniques, and the primary purpose of drilled holes is to make connections between circuits on opposite sides of the board.

Focusing first on Side A (component side) of the substrate 1, it is seen that the copper layer has been etched to form the conductive pattern 2 which includes solder pads 5 which circumscribe the openings of the drilled holes 3. (It is recalled, however, that some solder pads, such as those used for surface mounted components, need no drilled hole, and solder pads as used herein, is intended to encompass both configurations.) In practicing the invention, at least some of the etched copper solder pads are provided with extensions in the form of conductive tails 4 which form a part of the copper circuit pattern 2, but are sufficiently remote from the solder pads 5 that they can be protected. The solder pads 5, or at least the ones intended to receive circuit components, are left exposed throughout the fabrication process and are coated with solder 10 in the last step of manufacture, FIG. 1A. The conductive tails 4 run from specific solder pads 5 intended to interconnect subsequent layers of printed circuit traces. Those subsequent layers are formed by depositing patterns of conductive polymer to form traces 8 which interconnect selected ones of the tails 4 and thus the circuitry connected to the associated solder pad. The specific design of the circuit pattern determines the number of holes 3, solder pads 5, and conductive tails 4.

For example, as will be seen, a complex multilayer circuit pattern will require the presence of multiple conductive tails 4 to facilitate interconnection of printed circuit traces 8 between each layer while still protecting the circuitry against the eventual application of solder. The conductive tails 4 allow for the construction of a viable circuit connection between the printed circuit traces 8 and solder pads 5 while simultaneously providing a means, in combination with a solder mask 9 for completely sealing and shielding the printed circuit traces during the solder processes. The solder mask 9 does not have to be translucent but is in the this case.

Deposited over the primary circuitry 2, before application of the polymeric conductive traces 8, is a layer of dielectric material 7. The purpose of this dielectric insulator 7 is to allow layers of conductive patterns to be stacked, while preventing short circuiting between the layers of conductive patterns where they cross. The dielectric insulator 7 is deposited and masked in such a way that it will neither cover the solder pads 5 or the conductive tails 4. The currently preferred means for depositing the dielectric insulator 7 is by silk screening, although photoresist deposition techniques can also be used. The dielectric insllator 7 may be chosen from any number of organic chemicals commonly known for this purpose such as Hi-Sol SR 1000 manufactured by Dexter Chemical Company. The dielectric insulator 7, in combination with the subsequently printed circuit traces 8, also enables the production of a circuit board with multiple layers of printed circuit traces 8 on each surface. By equipping a substrate 1 with enough conductive tails 4, it is possible to print as many layers of circuitry on one surface of the board as required by the application. Each layer of printed circuitry 8 is separated from subsequently printed circuitry through the deposition of additional dielectric insulative layers 7.

Immediately over at the dielectric insulator 7 is deposited a secondary layer of circuitry 8. This secondary circuitry 8 is a polymeric ink which may be applied preferably by silk screening, although photoresist deposition techniques are applicable here as well. The preferred polymer is a vinyl resin containing silver such as P-1856 by Johnson Matthey Incorporated. This conductive vinyl resin has a much lower resistivity than the conductive epoxy resin used in the past and thus much less material is required to produce a functional circuit board. Also, the increased conductive vinyl resin allows for using much less material and in turn the production of much denser circuitry. Increased circuit density allows for the production of smaller boards at a reduced cost. As noted, the preferred means for applying the secondary circuitry 8 to the substrate 1 is through a silk screening processes. The vinyl circuit traces 8 are printed on and adhere to the dielectric insulator 7 so as to overlie and therefore connect selected ones of the conductive tails 4. Care, however, is taken to prevent the polymer traces 8 from running to the solder pads 5 themselves.

Over the top of the secondary circuitry 8, is deposited a solder mask 9 which will protect the conductive tails 4, and printed circuit traces 8 during the application of solder to the solder pads 5. Here again, a solder mask 9 is a conventional dielectric photoresist. This solder mask 9 is deposited, exposed, and developed through conventional photoresist techniques well known in the art. Of primary importance is that the solder mask 9 covers the conductive tails 4 which are in overlapping engagement with the printed circuit traces 8. The substrate 1 will be exposed to a solder bath when the substrate is dip coated to form a solder film 10 on the solder pads 5 and when the components are wave soldered to the substrate 1. The solder mask 9 also seals the printed circuit traces 8 from the environment preserving the conductivity of the circuitry and preventing migration of the printed circuit traces 8. After this the entire substrate 1 is dip soldered in a solder bath at which point a solder film forms over the entirety of exposed copper on both sides of the board to create the solder pads 10.

Figure 1C:
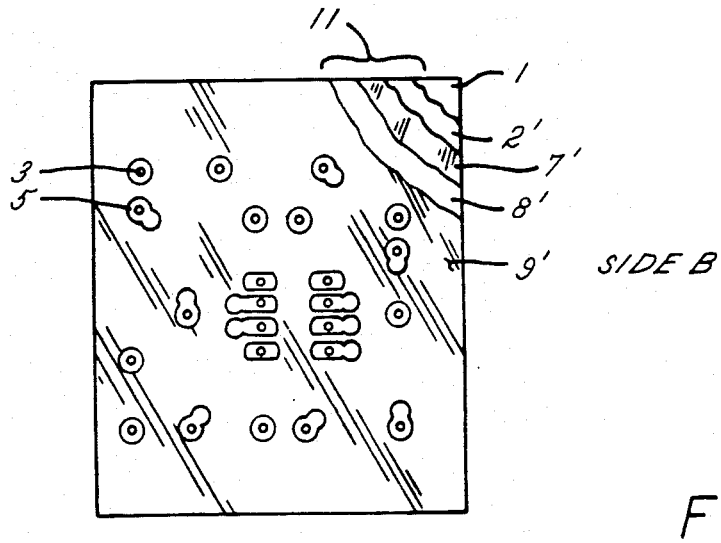
FIG. 1C is a plan view of the "solder side" (Side B) of the two sided multilayer circuit board of FIG. 1A.

Turning now to another aspect of the invention, the solder side of the substrate 1, Side B as shown in, FIG. 1C, uses the same materials as Side A, but in such a way as to create a power plane 11 having a distributed decoupling capacitance associated directly therewith. In contrast to side A where the circuit pattern 2 was configured as a fine array of circuit traces, the circuit pattern 2' is planar, covering most of the surface of substrate 1. Solder pads are also etched in the pattern 2' and most of them are isolated from the power plane by etching a thin line around the periphery of the pad, and its associated tail, if present. Those solder pads which are intended to receive power of the polarity carried by the plane 2' are connected to the plane by unetched copper connections between the plane and pad. The planar copper pattern 2' will serve as one polarity of a power plane for the board. Circuit traces 2 from Side A are connected to the power plane 2', Side B, by way of plated through holes 3. Deposited over the copper plane 2' is thin insulative dielectric layer 7' similar to that deposited on Side A. This dielectric layer 7' can be any conventional organic polymer which allows for adequate electrical insulation and which has an appropriate dielectric coefficient so that when it is deposited in a thin but practical layer, it provides a useful level of distributed capacitance. When using the aforementioned Hi-Sol SR 1000 dielectric, a uniform film of about 1 mil thickness can be reliably deposited and yields a distributed capacitance of about 0.001 microfarads per square inch. Such level of distributed capacitance is very useful for decoupling radio frequency energy. The dielectric insulator 7' is patterned in such a way as to expose the copper solder pads 5' and the tails 4' associated with some of them.

Immediately over the insulative dielectric 7' is printed a ground plane composed of conductive polymer 8' for the distributed decoupling system on Side B of the substrate 1. Here again, the conductive polymer 8' is a vinyl resin which preferably is the same as that used to define the printed circuit traces 8 on the opposite side (Side A) of the board, FIG. 1B. The ground plane 8' is patterned in such a way so as to outline the solder pads 5' and makes connections to tails 4' associated with the solder pads who are to receive power from this level of the plane. Separation of the power plane 2' from the ground plane 8' by approximately 1 mil affords the circuit board a capacitance of approximately 0.001 microfarads per square inch. On boards carrying dense circuitry it is not uncommon for the transmission of a signal through one circuit trace to prompt a signal in another parallel or adjacent circuit trace due to the electrical and magnetic field effects created by the first signal. Previously, it was necessary to mount capacitors at varying locations on the surface of the circuit board to prevent this effect. However, the present invention solves the decoupling problem with a distributed capacitance system which can be laid directly on the substrate surface or deposited over multiple layers of circuit traces already on the surface of the substrate. A translucent solder mask 9' is deposited over the ground plane 8' which is exposed and defined in such a way as to outline the solder pads 5'. Here again, the solder mask 9' acts to protect the underlying polymeric layers during the dip soldering and wave soldering processes. The solder mask 9' will also prevent the migration of the vinyl resin ground plane 8' once it is exposed to its application environment. The entire board is subsequently dipped in a solder bath whereby a solder film will form across all the exposed copper circuitry 2, 2' on the board including the solder pads 5, 5'. The copper plating 6 on the interior walls of the drilled holes 3 (FIG. 1B) and any primary circuit traces 2 which have remained exposed throughout the fabrication process.

A number of benefits result from the construction thus far described. This design allows for fabrication of circuit board with printed circuitry 8 on both sides of the substrate 1 and which can also carry components mounted on both sides of the substrate 1. Also, more complex circuit boards can be fabricated allowing use in more advanced applications. Furthermore, the more efficient use of substrate 1 surface area lessens the material requirements of producing circuit boards and, in turn, lowers costs. The primary circuitry is also formed from the initial copper cladding deposited on the substrate 1 and runs between various drilled holes 3. The primary circuitry 2, however, does not run to all the specific holes 3 in the substrate 1. Certain holes 3 will be used later to connect the secondary printed circuit traces 8 to the opposite side of the substrate 1.

Fabrication Process

The process for fabricating the two sided multilayer circuit board, similar to the circuit board shown in FIG. 1A, can be broken up into six steps. Again, while the four layer board previously described herein is the subject of the following fabrication process, it should be understood that this fabrication process also applies to other embodiments of the circuit board. These should be understood to include both single sided and double sided multilayer boards, as well as such boards with or without distributed decoupling systems.

Focusing on FIG. 2A, the process is initiated with a multilayer laminated fiber glass substrate 1 which has firmly adhered to one or both of its surfaces a layer of copper cladding 2, 2'. The raw board, after being trimmed to the appropriate size, is drilled according to a predefined drill pattern to produce a plurality of holes. The number of holes as well as the pattern of the holes themselves is dictated by the eventual circuit pattern that the board is intended to carry. It should also be noted that it is possible to omit the drilling of many, or in some cases any, holes using this process if the board is being prepared for surface mounted components. Other than the omission of mounting holes, and provision of the necessary feed through to the interconnect circuits on opposite sides of the board, fabrication of a board for surface mounted components would proceed with the same steps as that of a drilled substrate 1 to be described below.

As shown in FIG. 2B, the holes 3 are drilled completely through the substrate 1 and the copper layers 2, 2'. In the illustrated embodiment, the copper cladding 2 on Side A will go on to become the primary copper circuit traces 2 (FIG. 3A), the solder pads 5, and the conductive tails 4. The copper cladding 2' on Side B will serve as one pole of the power plane 11 as well as being etched to provide solder pads 5' and copper tails 4' as required for connections (primarily to the power plane in this illustration) on Side B. However, in some applications, prior to etching the copper layers 2, 2' (FIGS. 3A and 3B) copper 6 is plated onto the interior walls 6 of the drilled holes FIG. 3B. The electroless copper process plates copper onto the interior walls of the hole while having no substantial effect on the copper cladding 2 lying on the exterior surfaces of the substrate 1 and without completely closing the hole 3. It will be necessary to keep these holes 3 open so as to later allow connection of components to the circuit board.

Since this embodiment uses the copper layer for some of the circuit traces, the next fabrication step involves defining the primary circuit traces 2 (as well as the solder pads 5 and tails 4) on Side A of the Substrate 1, FIG. 3A. In order to define the circuitry shown on FIG. 3A, a dry film photoresist is laminated to the surface of the copper layer 2. In defining the various levels of circuitry, solder pads and conductive tails, and dielectric insulator conventional masks and designs are altered to fulfill the requirements of the process of this invention. The standard pad mask is altered to include conductive tails where necessary. The conventional conductor patterns are modified to assure that those to be implemented by conductive polymer intersect the tails rather than the pads. The power ground plane pad master is used to expose and develop the etch mask which will define the solder pads 5, conductive tails 4 and primary copper circuit traces 2 from the copper cladding deposited on the surface of the substrate 1. Using these altered artworks, the photoresist is masked, exposed, developed, and cleaned through processes well known in the art. The result is a dielectric coating over the entire area of the copper layers 2, 2' except for those segments of copper cladding which will be left on the substrate to become the circuitry 2 or power plane 2'. The entire substrate is then copper plated resulting in a copper coating over the dielectric mask and the exposed copper cladding 2, 2'. This also results in deposition of a copper layer 6 in the holes 3 to form plated through holes. After this, the entire board is immersed in a solder plating bath which deposits a tin/lead solder over the entire surface of the copper and within the plated holes. The tin/lead solder will act as an etch resist during the process of defining the circuitry 2, 2'. The photoresist mask is then removed with a caustic soda solution leaving the intended circuit traces and power plane covered by plated copper and an exterior solder coat. The board is then subjected to an etching process whereby the copper unprotected by solder is removed from both sides of the board. The tin lead solder is then removed using a solder strip such as the 1123 strip agent sold by Ardrox Chemical Company and the board is subjected to a chemical cleaning. The result on Side A is the copper circuit traces 2, FIG. 3A, solder pads 5, and conductive tails 4 running therefrom, and on Side B the ground plane 2', solder pads 5', tails 4' and connections between the ground plane and the pads 5 intended to receive power of that polarity. In an alternate process, the solder plating step can be replaced by a plating step using tin/nickel. The higher melting point of the tin/nickel alloy enables this solder coating to withstand the thermal strain of subsequent processing. That material can remain deposited over the copper, eliminating the need for the solder stripping operation. Accordingly, any reference to bonding on copper hereinafter should be read to also encompass, in the alternative, bonding onto the tin/nickel coating.

Turning now to FIGS. 4A and 4B, an insulative dielectric mask 7, 7' is applied across the surface of the etched copper 2, 2'. This dielectric mask covers the primary circuit traces 2, however, it is deposited, exposed and developed so as to leave the solder pads 5, and the conductive tails 4 running therefrom, uncovered. Similarly, the power plane on Side B is covered, but the solder pads 5' and conductive tails 4' left exposed. The insulative layer 7 will prevent short circuiting between the copper circuit traces 2 and what will eventually be deposited as a second layer of printed circuit traces 8, FIG. 5A. Furthermore, the dielectric insulator 7 provides a much more efficient means of isolating interconnection points, i.e., solder pads 5 and conductive tails 4, without requiring the high alignment tolerances characteristic of the past.

The dielectric insulator 7 is also deposited or Side B of the substrate in one uniform layer. In order to develop the intended distributed capacitance the dielectric insulator 7 must be deposited as a continuous insulating layer, but as thin as practical. It is currently preferred to use a thickness of about 1 mil. The capacitance produced by a layer of the preferred dielectric of that thickness when sandwiched between two conductive planes is about 0.001 microfarads per square inch. The insulative dielectric 7, 7', after being silk screened onto both sides, is then cured by heat or infra-red energy. Common parameters for curing the dielectric insulator 7 are one hour of cure time at about 200° F. After the dielectric insulator 7 is cured the circuit board is dipped in a sulfuric acid solution and then mechanically scrubbed to remove any metal oxides or other contaminants which may have formed on the solder pads 5 and conductive tails 4.

A second layer of circuitry is printed on the board through conventional silk screening techniques, FIG. 5A. The conductive polymer 8 is printed on the dielectric insulator using a silk screen mask, which outlines the printed circuit traces 8. It is important that the silk screen mask and pad master are designed so as to result in an overlap between the conductive tails 4 and the associated printed circuit traces 8. It is also possible to deposit the conductive circuit traces 8 and ground plane 8', Side B, FIG. 1C, through conventional photo deposition techniques. The vinyl circuit traces 8 are printed on the dielectric insulator 7 so as to overlap, and lie in engaging contact, with the conductive tails 4, but to avoid the solder pads 5. The use of these conductive tails 4, in combination with the later applied solder mask 9, allows for the complete insulation of the printed vinyl circuit traces 8. As a result the entire board can be submerged in a solder bath and both sides of the board can be exposed to wave soldering processes without damaging the printed vinyl circuit traces 8. In turn the ability to expose both sides of the substrate 1 allows maximization of the surface area of the finished circuit board allowing for much more complex circuitry as well as the mounting of components on both sides of the board.

A uniform layer of conductive vinyl ink 8' is also printed on Side B of the board to serve as a ground plane for the power distribution system, FIG. 5B. The ground plane completes the distributed decoupling system on Side B of the board by acting as the second plate of a large planar capacitor. Once the printed circuit traces 8 and ground plane 8' are screened onto the dielectric insulator 7, FIG. 5A, the ink should be cured preferably for a minimum of one hour at about 165° F. This curing step can also be completed in an infra-red tunnel.

It is at this point in the process that successive subsequent layers of dielectric insulator 7 and printed circuit traces 8 can be deposited on the partly processed board. The process of this invention allows the development of multiple layer circuit systems which have as many layers of circuitry as are dictated by the requirements of the board's eventual application. At the same time, the ability to deposit multiple layers of circuitry on both sides of the board expands the possible applications and uses that the circuit boards can be put to, thus providing a much more marketable product for the electronics industry.

Figure 6A:
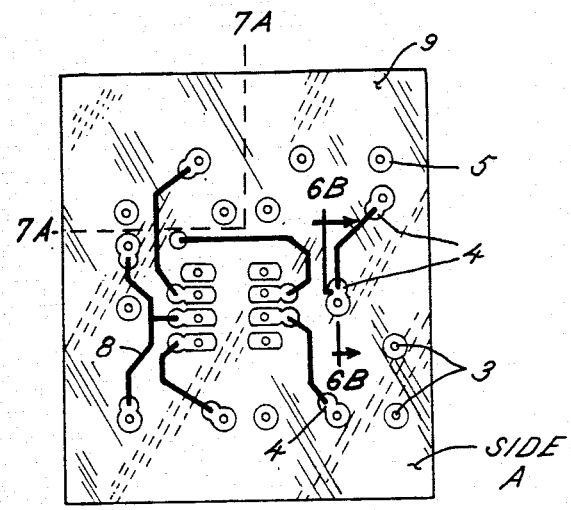
FIG. 6A and 6B show the circuit board of FIG. 5A with a translucent solder resist having been applied as a top protective layer, covering all of the polymer but leaving the solder pads exposed.
Figure 6B:
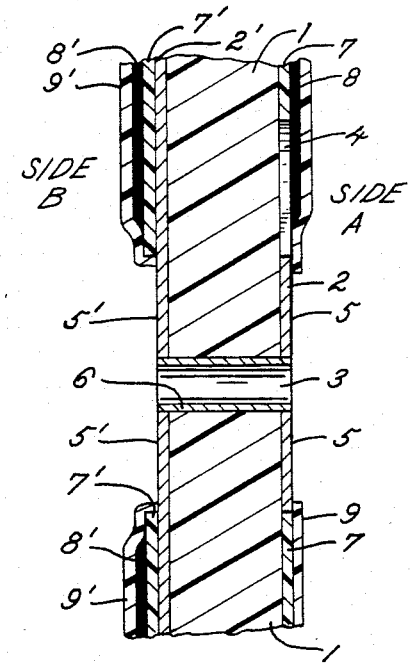

Once the final layer of printed circuitry has been printed, solder mask 9 is deposited over both Side A and B of the substrate 1. A mask is used to expose and develop the solder resist 9 so that the resist will cover the entire surface of the board except for the solder pads 5 which are to be solder coated to receive components. It is noted parenthetically that certain solder pads are provided only as interconnection points, and are not intended to receive components; these can be covered with solder resist 9. As can be seen from FIG. 6A, the solder mask 9 covers all the printed circuitry and the conductive tails 4, and therefore all of the polymer. Only the solder pads 5 on Side A and B are left exposed. The purpose of the solder mask 9 is to protect the printed circuitry 8 and the connections made between that circuitry 8 and the conductive tails 4 against the final step of the process which is the solder bath as well as from the environment in later use. Here again, the solder resist 9 can be any of the number of conventional photopolymers such as DuPont's Vacril 8030. The primary characteristic which dictates the choice of products for use as a solder mask 9 is a tolerance to high temperature environments such as solder baths. The solder mask 9 is applied and defined through the use of conventional photoresist masking, deposition, exposure, and developing processes. Once the photo polymer is developed and the excess solder resist removed, the solder mask 9 is cured in an oven for one hour at about 325° F.

Figure 7A:
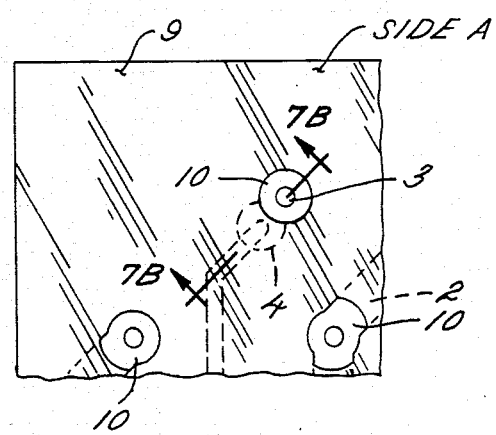
Figure 7B:
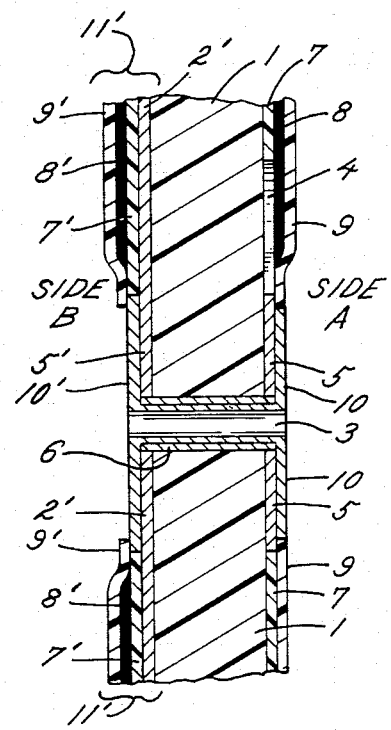

The almost completed circuit board is then hot air leveled. The board is dipped in 10% hydrochloric acid to remove any copper oxides which are formed in the high heat of the curing processes. Next the substrate is completely immersed in a solder bath to allow solder to flow over both Side A and B as well as into the holes 3. The solder of preferences is a solution of 63% tin/37% lead. An air jet is directed onto the surface of the board as it is lifted from the solder bath to clear the holes 3, leaving only a thin plating therein. As shown in FIGS. 7A and 7B, the solder forms over all exposed copper such as the solder pads 5 and the interior walls of the holes 3. The printed secondary circuitry 8 and the conductive tails 4 are shield or covered by the solder resist 9 so as not to be exposed to the solder bath.

Alternative Embodiments

One of the benefits of the process of this invention is the ability to adapt the process to any number of circuit designs which are needed to fulfill a specific application. Another common circuit board configuration is a board containing double layer printed circuitry on both sides, where the circuitry on one side is covered by an additional distributed capacitance power plane 11, FIG. 8A-B. As can be seen, FIG. 8A, the component side or Side A of substrate 1 carries the circuitry already disclosed in the previous embodiment. On Side B, the solder side of the substrate 1, FIG. 8B, it is evident that the first two layers of circuitry, for purposes of illustration, are the same as those on Side A. However, on Side B, instead of depositing a final solder mask 9 over the printed circuitry 8, another layer of dielectric insulator 7 is deposited over the circuitry 8. Immediately over the dielectric insulator 7 is printed a layer of conductive polymer 8'. The purpose of this polymer will be to serve as one pole of the power plane. The power plane 8' is printed in such a way that the solder pads 5 and conductive tails 4 remain exposed. Immediately over the power plane 8' is deposited another layer of dielectric insulator 7 which is preferably about 1 mil thick. Over the dielectric insulator 7 is printed another layer of conductive polymeric ink 8". This additional layer of conductive polymer will serve as a ground pole of the power plane for the distributed decoupling system which has now been completed. The 1 mil thick dielectric insulator 7 as well as the ground plane 8" are deposited in such a way so as to leave the solder pads 5 uncovered. The final solder mask 9 will be deposited over the ground plane 8" so as to protect the polymeric layers during soldering and later use. By fabricating an additional distributed capacitance power plane on Side A it is possible to further increase the capacitance of the board.

FIGS. 8A and 8B also illustrate a board with surface mount solder pads 12 instead of the plated through hole 3 type of bonding system disclosed earlier. Circuit components are soldered to surface mount solder pads 12 using either solder paste or wave soldering processes. The use of surface mount solder pads 12 does not alter the multilayer fabrication process.

Figure 9A:
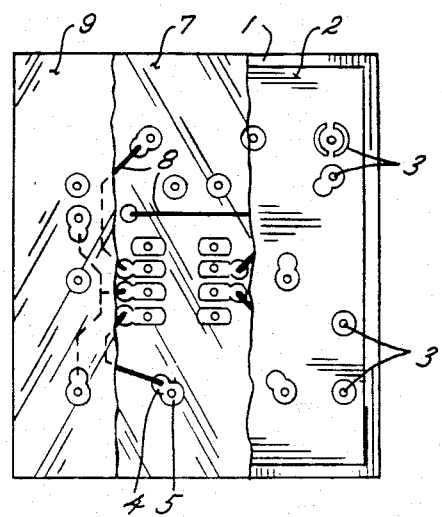
FIG. 9A is a plan view of the "component side" (Side A) of another embodiment of the two-sided multilayer circuit board of present invention intended for high energy loads.
Figure 9B:
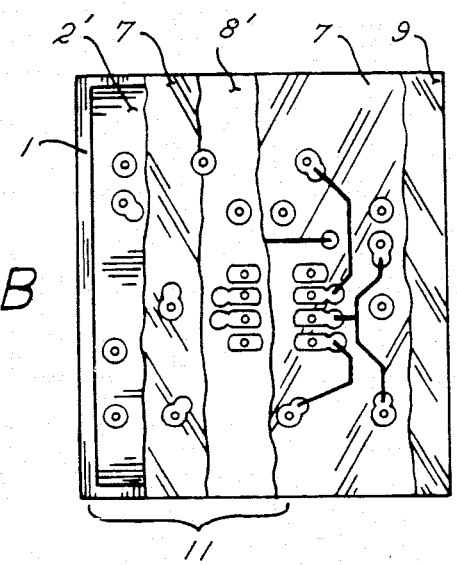
FIG. 9B is a plan view of the "solder side" (Side B) of the two-sided multilayer circuit board of FIG. 9A.

Another potential embodiment, FIG. 9, of the circuit board is one which is capable of taking high power components through use of a copper ground plane 2 on Side A. In this embodiment, FIG. 9A, Side A of the substrate 1 retains the copper cladding 2 as a ground plane like the ground plane 2' of the FIG. 1 embodiment (including pads, tails, etc.). A layer of dielectric insulator 7 is deposited over the ground plane and patterned, exposed and developed in such a way so as to leave exposed the solder pads 5 and conductive tails 4. The conductive polymeric circuit traces 8 are then printed immediately on top of the dielectric insulator 7. A final layer of solder mask 9 is deposited over the printed conductive circuit traces 8 and the dielectric insulator 7 covering all surfaces except the solder pads 5. On Side B of the board, FIG. 9B, the other pole of the power plan, is also defined in copper before the conductive circuit traces 8 are printed on the substrate 1. As can be seen, the copper cladding 2' is left in place on substrate 1 to serve as a power plane for the distributed decoupling system 11. Immediately over the copper cladding 2' is deposited a dielectric insulator 7 and a ground plane of conductive polymer 8'. This ground plane 8' provides a distributed capacitance effect while the high power introduced onto the board is carried by the copper planes on either side of the board. Here again, the conductive polymer 8' is printed in such a way so as to retain the outline out of the solder pads 5 as well as the conductive tails 4. Immediately over the ground plane 8' is deposited another layer of dielectric insulator 7 onto which is printed the conductive circuit traces 8 which engagingly overlap the conductive tails 4. A final solder mask 9 is printed over the entire area of Side B of the substrate 1 except for the solder pads 5 which are solder coated.

Figure 10A:
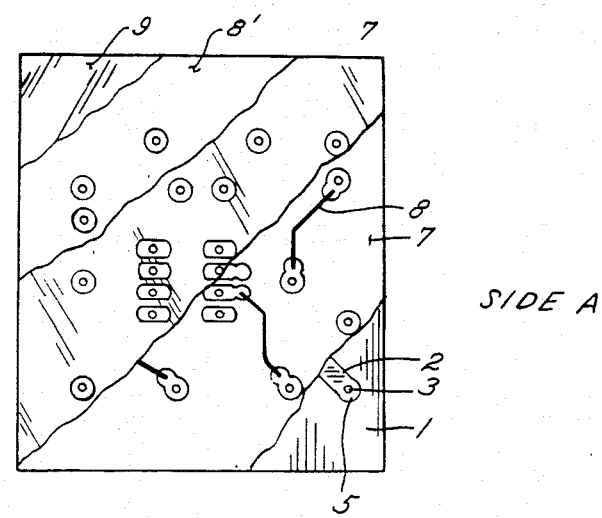
FIG. 10A is a plan view of the "component side" (Side A) of another embodiment of the two-sided multilayer circuit board of present invention intended to provide decoupling to reduce RF noise and effects.
Figure 10B:
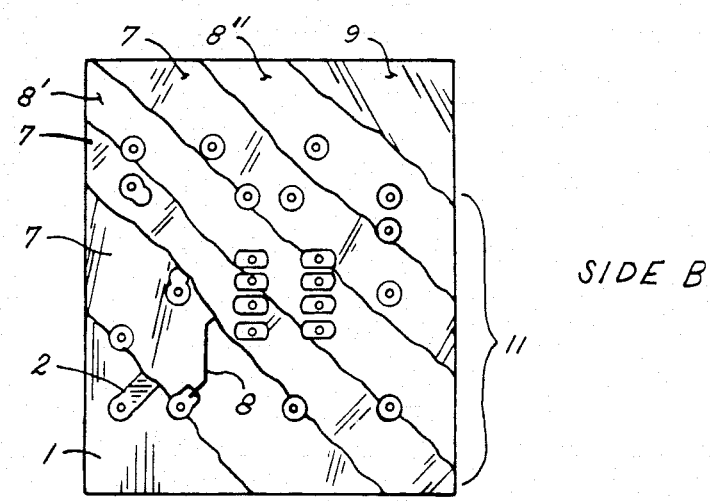
FIG. 10B is a plan view of the "solder side" (Side B) of the two-sided multilayer circuit board of FIG. 10A.

Another embodiment, FIG. 10, is one which not only reduces the decoupling effect on densely printed circuitry but also reduces cross talk and R.F. noise across the surface of the board. These advantages are accomplished by printing a ground plane 8' over the double layer of circuitry on Side A of substrate 1, FIG. 10A. Side A of this embodiment carries a single layer of circuitry which has been deposited and defined exactly as circuitry in earlier embodiments. Here again, the ground plane 8' is insulated from the printed circuitry 8 through the application of an additional layer of dielectric insulator 7 and allows for complete coverage of Side A except for the solder pads 5 and conductive tails 4. On Side B, FIG. 10B, a double layer of circuitry is first deposited in accordance with the processes of this invention is subsequently covered with a distributed decoupling system 11. The distributed decoupling system 11 is composed of a printed power plane 8', interposed dielectric layer 7 and upper ground plane 8''', FIG. 10B.

It will now be appreciated that what has been provided is an improved multilayer printed circuit board in which conventional copper is effectively married with polymeric technology to produce circuit configurations which can be as complex and substantially as reliable as conventional multilayer circuit boards, but produced at a fraction of the cost. In addition, the ability to deposit thin alternating layers of dielectric and insulating polymer produces a power plane with its own built-in distributed decoupling capacitance, eliminating or reducing the need for discrete decoupling capacitors.

What is claimed is:

1. A multilayer circuit board for mounting and establishing electrical connections between a plurality of electrical components intended for later mounting on the circuit board, said multilayer circuit board comprising in combination:

a supporting substrate having a copper layer on at least one side etched to form (a) an array of solder pads for receiving the components to be mounted on said circuit board, and (b) conductive tails connected to said solder pads for providing protected electrical connections to said solder pads, a dielectric layer over said copper layer leaving said tails and said pads exposed, conductive polymer traces over said dielectric layer interconnecting selected ones of said tails thereby to form connections between selected ones of said pads, a solder mask over said conductive polymer leaving said pads exposed but covering said tails thereby to shield the polymer, and a solder layer plated onto the exposed solder pads for providing a surface for solder connections to the electrical components.

2. The multilayer circuit board of claim 1, wherein said copper layer is additionally etched to form conductive copper traces interconnecting selected ones of said solder pads.

3. The multilayer circuit board of claim 1, wherein said copper layer is additionally etched to form one layer of a distributed decoupling power plane connected to selected ones of said solder pads.

4. The multilayer circuit board of claim 1, wherein said circuit board has multiple alternating layers of conductive polymer and dielectric, said polymer traces interconnecting selected ones of said pads and said dielectric layer leaving said solder pads and selected ones of said tails exposed, and the solder mask sealingly covers the uppermost layer of said conductive polymer traces while leaving said solder pads exposed.

5. The multilayer circuit board of claim 4, wherein said circuit board has multiple alternating layers of conductive polymer traces and dielectric on both surfaces of said substrate.

6. The multilayer circuit board of claim 1, wherein the second side of said supporting substrate has deposited thereon a distributed decoupling system comprising two conductive layers separated by a thin dielectric layer.

7. The multilayer circuit board of claim 6, wherein said first conductive layer is copper connected to selected ones of said solder pads, said second conductive layer is conductive polymer connected to other selected ones of said solder pads, and a thin dielectric layer is interposed between said copper and conductive polymer layers to create a distributed decoupling capacitance over the surface of said circuit board.

8. The multilayer circuit board of claim 6, wherein said two conductive layers are conductive polymer connected to respective selected ones of said solder pads, and a thin dielectric layer is interposed between said two conductive polymer layers to create a distributed decoupling capacitance over the surface of said circuit board.

9. The multilayer circuit board of claim 1, wherein said circuit board contains at least one array of holes, said holes penetrating said solder pads to receive conductive leads of the circuit components so that said leads can be soldered to said solder pads.

10. The multilayer circuit board of claim 1, wherein said circuit board contains an array of undrilled solder pads for receiving surface mounted components.

11. The multilayer circuit board of claim 4, including a distributed decoupling system which comprises two conductive layers separated by a thin dielectric layer, said two conductive layers being conductive polymer connected to respective selected ones of said solder pads, a said thin dielectric layer interposed between said conductive polymer layers to create a distributed capacitance over the surface of said circuit board, the distributed decoupling system being deposited over said multiple alternating layers of conductive polymer and dielectric on one surface of said circuit board.

12. The multilayer circuit board of claim 11, wherein a layer of conductive polymer is deposited over said multiple alternating layers of conductive polymer and dielectric on the second side of said circuit board to reduce decoupling effects and interference between underlying circuit traces.

* * * * *